United States Patent [19]
Schmidt et al.

[11] Patent Number: 5,674,934
[45] Date of Patent: Oct. 7, 1997

[54] REVERSIBLE AND IRREVERSIBLE WATER-BASED COATINGS

[75] Inventors: Donald L. Schmidt; Gene D. Rose; Barbara A. Miller, all of Midland, Mich.

[73] Assignee: The Dow Chemical Company, Midland, Mich.

[21] Appl. No.: 606,179

[22] Filed: Feb. 23, 1996

[51] Int. Cl.$^6$ .................... C08L 39/00; C08L 33/00; C08L 27/00; C08F 6/00

[52] U.S. Cl. .................... 524/555; 524/543; 524/544; 524/547; 524/556; 523/201; 526/310; 528/482; 528/490

[58] Field of Search .................... 524/555, 543, 524/544, 547, 556; 528/582, 490; 523/201; 526/310

[56] References Cited

U.S. PATENT DOCUMENTS

| | | | |
|---|---|---|---|
| 3,947,396 | 3/1976 | Kangas et al. | 260/29.3 |
| 4,544,697 | 10/1985 | Pickelman et al. | 524/458 |
| 4,544,723 | 10/1985 | Upson et al. | 524/555 |
| 4,582,663 | 4/1986 | Pickelman et al. | 264/517 |
| 4,622,360 | 11/1986 | Gomi et al. | 524/507 |
| 4,704,324 | 11/1987 | Davis et al. | 428/308.4 |
| 4,859,384 | 8/1989 | Fibiger et al. | 264/45.1 |
| 4,929,666 | 5/1990 | Schmidt et al. | 524/516 |
| 5,310,581 | 5/1994 | Schmidt et al. | 427/558 |

OTHER PUBLICATIONS

Chemical Reg. No. 45076–54–8.
Chemical Reg. No. 51441–64–6.
Chemical Reg. No. 63810–34–4.
Chemical Reg. No. 73082–48–1
Chemical Reg. No. 82667–45–6.
Chemical reg. No. 93926–67–1.
Chemical Reg. No. 122988–32–3.
Chemical Reg. No. 145425–78–1.
Chemical Reg. No. 149186–03–8.
Chemical Reg. No. 151938–12–4.
Chemical Reg. No. 166740–88–1.

Daniels, E. S. et al., Progress in Organic Coatings, vol. 19, pp. 359–378 (1991).

Kötz, J. et al., Acta Polymer, vol. 43, pp. 193–198 (1992).

Padget, J. C., Journal of Coatings Technology, vol. 66, No. 839, pp. 89–105 (1994).

Ooka, M. et al., Progress in Organic Coatings, vol. 23, pp. 325–338 (1991).

Shalbayeva, G. B., et al., Polymer Science U.S.S.R., vol. 26, No. 6, pp. 1421–1427 (1984).

*Primary Examiner*—Tae Yoon
*Attorney, Agent, or Firm*—Reid S. Willis

[57] ABSTRACT

A composition comprising an aqueous-based solvent and a water-soluble or water-dispersible polymer that is characterized by having a backbone with at least one pendant weak acid group and at least one pendant strong cationic group associated with a bicarbonate counterion is described. A water-resistant, fast dry-to-the-touch coating that does not release noxious gases can be prepared by applying the composition to a substrate. The coating can be designed to be either permanent, or removable by the addition of mild acids such as aqueous solutions of vinegar or citric acid.

16 Claims, No Drawings

20

REVERSIBLE AND IRREVERSIBLE WATER-BASED COATINGS

BACKGROUND OF THE INVENTION

The invention relates to water-dispersible polymeric compositions that can be used to prepare removable or permanent coatings.

Coatings are generally made to provide a protective barrier for applications such as floors, automobiles, exteriors and interiors of houses, and human skin. Protective coatings for floors, for example, have been known since the mid 1950s. Many of the early coating materials were applied using petroleum- or naphthene-based solvents and as such were undesirable due to the toxicity and flammability of these solvents.

Water-based synthetic emulsion compositions such as styrene resin emulsions, styrene-acrylate copolymer resin emulsions, and acrylate emulsions, developed in the early '60s, gradually replaced organic solvent-based compositions. Although the water-based compositions are preferable to organic solvent-based compositions, they suffer from the disadvantage of being difficult to remove in an application where removability is desired. Removal of coating may be desirable because even the most durable coatings tend to deteriorate due to soiling or wear and tear. In other applications, such as protective care products for the skin, the advantages of water-based removable coatings are obvious.

Removable, water-based coatings are known. For example, polymers that contain ammonium carboxylate functionality are water compatible, but become incompatible through the loss of solvent and ammonia.

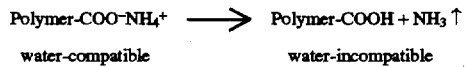

water-compatible  water-incompatible

Water-resistant coatings made by the above-illustrated process can be subsequently removed by contact with an aqueous alkaline liquid, which converts the acid back into the compatible salt.

The ammonium carboxylate coating suffers from several disadvantages: 1) the formulations are malodorous and irritating to the eyes and skin; 2) long set times are required to attain acceptable physical properties of the coating; and 3) the removal or stripping process requires the use of hazardous alkaline liquids.

For example, in U.S. Pat. No. 4,622,360, Gomi et al. discloses a removable water-borne polyurethane resin containing carboxyl groups. Coating compositions can be prepared by adding a polyvalent complex-forming metal to the water-borne resin. The polyvalent metal forms a stable water-dispersible complex with the resin in the aqueous solution. When the dispersion is applied to a floor surface, noxious volatile materials evaporate to allow the polyvalent metal ions to initiate a crosslinking of two or more carboxyl groups, thereby forming a hardened, water-incompatible coating. This hardened coating can be removed, but only with a harsh alkaline solution containing ligands such as ethylene diamine tetraacetic acid.

In view of the deficiencies of the known art, it would be desirable to have a composition that provides a coating that rapidly dries to the touch at ambient temperatures and that can be designed to be either permanent or easily removed without the use of harsh solvents.

It would further be useful to have a hypoallergenic, non-toxic, water-based composition that provides a coating that gives long-lasting protection to the skin against sun, dryness, and harsh chemicals, but that can be easily removed without the use of harsh chemicals.

SUMMARY OF THE INVENTION

The present invention is an organic polymer comprising a backbone with at least one pendant weak acid group and at least one pendant strong cationic group associated with a bicarbonate counterion.

In a second aspect, the present invention is a composition comprising a water-based solvent and a water-compatible polymer comprising a backbone with at least one pendant weak acid group and at least one pendant strong cationic group associated with a bicarbonate counterion.

In a third aspect, the present invention is an article comprising a substrate and a water-resistant coating adhered thereto, wherein the coating is prepared by the steps of:

a) applying to the substrate a composition comprising an aqueous-based solvent and a water-compatible polymer having at least one pendant weak acid group and at least one pendant strong cationic group associated with a bicarbonate counterion; and b) evaporating the solvent to form the coating.

In a fourth aspect, the present invention is a method of preparing a composition comprising an aqueous-based solvent and a water-compatible polymer that is soluble in the water-based solvent, the polymer having a backbone with at least one pendant weak acid group and at least one pendant strong cationic group associated with a bicarbonate counterion, the method which comprises the steps of:

a) preparing a solution comprising a first aqueous-based solvent and a polymer having a backbone that contains at least one pendant weak acid group and at least one pendant strong cationic group associated with a non-bicarbonate counterion;

b) adding sufficient base to the solution to precipitate at least a portion of the polymer;

c) washing the precipitate with water; and d) contacting the precipitate with a second aqueous-based solvent and a sufficient amount of carbon dioxide or carbonic acid to render the precipitate soluble in the second aqueous-based solvent.

In a fifth aspect, the present invention is a method of preparing a stable aqueous dispersion of a polymer having a backbone with at least one pendant weak acid group and at least one pendant strong cationic group associated with a bicarbonate counterion, the method which comprises the steps of:

a) preparing a stable aqueous dispersion of a polymer having weak acid groups, and strong cationic groups associated with non-bicarbonate counterions; and b) exchanging at least a portion of the non-bicarbonate counterions with bicarbonate counterions.

A water-resistant, fast dry-to-the-touch, non-tacky coating that can be formed at room temperature and does not release noxious volatile materials is inherently prepared from the composition of the present invention. This coating can be designed to be either permanent, or removable by contact with even mildly acidified aqueous-based solvents such as aqueous solutions containing vinegar or citric acid.

DETAILED DESCRIPTION OF THE INVENTION

The polymer of the present invention, which is preferably a water-compatible polymer, is characterized by having a backbone with at least one pendant weak acid group and at least one pendant strong cationic group associated with a bicarbonate counterion. As used herein, the term "water-compatible polymer" refers to a polymer which will form a stable or metastable mixture with water, including a solution, a colloidal suspension, a stable emulsion or a dispersion. The term "strong cationic group" refers to a cation having a charge that is independent of pH. The term "weak acid group" refers to an acid having a $pK_a$ in the range of from about 2 to about 7. Similarly, the term "anion of a weak acid group" refers to an anion of an acid having a $pK_a$ from about 2 to about 7. Preferably, the polymer backbone contains a plurality of weak acid pendant groups, anions of weak acid pendant groups, and strong cation pendant groups. Preferably, the mole-to-mole ratio of weak pendant acid groups plus anions of weak acid groups to strong cationic pendant groups is not less than 0.3, more preferably not less than 0.5, most preferably not less than 0.7. Preferably, the ratio of weak pendant acid groups plus anions of weak acid groups to strong cation pendant groups is not more than 3.3, more preferably not more than 2, and most preferably not more than 1.4.

The polymer can be represented by the following formula:

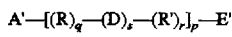

where A' and E' are terminal groups formed by the type of polymerization reaction employed; q, r, and s represent molar ratios, wherein s is non-negative, and q and r are both positive, with the proviso that q+r+s=1.00; p is a degree of polymerization, preferably, from about 2 to about 1,000; R is a unit derived from the polymerization of an ethylenically unsaturated monomer containing at least one pendant weak acid group; R' is a unit derived from the polymerization of an ethylenically unsaturated monomer containing at least one pendant strong cationic group associated with a bicarbonate counterion; and D is a unit derived from a non-interfering ethylenically unsaturated monomer, wherein R, D, and R' are arranged in any sequence.

The polymer may also be represented by the following formula:

where R" is a unit derived from the polymerization of an ethylenically unsaturated group containing at least one strong anionic group and at least one weak acid group; A", E", D, p, q, and s are as previously defined; and q+s=1.00.

A polymer having a backbone with at least one pendant weak acid group and at least one pendant strong cationic group associated with a bicarbonate counterion can be prepared by the polymerization of a bicarbonate salt of a polymerizable strong cationic monomer and a polymerizable weak acid monomer optionally in the presence of a carbon dioxide cosolvent. The polymer can also be prepared by first preparing a polymer precursor containing a weak acid group and a strong cationic group associated with a non-bicarbonate counterion such as a halide, a nitrate, a sulfate, or a salt of a sulfonic acid ($R-SO_3^-$, more preferably a halide, most preferably chloride.

The polymer precursor can be prepared in a variety of ways including:

a) copolymerization of a polymerizable monomer having a weak acid group and polymerizable monomer having a strong cationic group associated with a non-bicarbonate counterion;

b) polymerization of a polymerizable monomer that contains both weak acid and strong cationic functionality;

or c) post reaction of a polymer having reactive functionality. The polymer preparation preferably includes a non-interfering, polymerizable monomer (units of which are represented by D in the structural depiction of the polymer). The term "non-interfering, polymerizable monomer" is used herein to refer to one or more monomers that do not adversely affect the formation and properties of a coating prepared from the polymer.

Suitable polymerizable monomers containing a weak acid group include ethylenically unsaturated compounds having carboxylic acid, phenolic, thiophenolic, and phosphinyl functionality. Examples of suitable polymerizable monomers include acrylic acid, methacrylic acid, itaconic acid, β-carboxyethyl acrylate (usually as a mixture of acrylic acid oligomers), vinylbenzoic acid, vinylchlorophenol, vinylbromophenol, vinylthiophenol, and 2-propenoic acid: 2-methyl-, (hydroxyphosphinyl) methyl ester, or a combination thereof.

Suitable polymerizable monomers containing a strong cation group associated with a non-bicarbonate counterion include salts of ethylenically unsaturated compounds having quaternary ammonium, sulfonium, cyclic sulfonium, and phosphonium functionality. Examples of suitable monomers having quaternary ammonium functionality include ethylenically unsaturated trialkylammonium salts such as vinylbenzyl tri-$C_1$–$C_4$-alkylammonium chloride or bromide; trialkylammoniumalkyl acrylates or methacrylates such as 2-[(methacryloyloxy)ethyl]-trimethylammonium chloride and N,N-diethyl-N-methyl-2-[(1-oxo-2-propenyl)oxy] ethanaminium methyl sulfate (Chem. Abstracts Reg. No. 45076-54-8); and trialkylammoniumalkyl acrylamides such as N,N,N-trimethyl-3-[(2-methyl-1-oxo-2-propenyl)amino] -1-propanaminium chloride (Chem. Abstracts Reg. No. 51441-64-6) and N,N-dimethyl-N-[3-[(2-methyl-1-oxo-2-propenyl)amino]propyl]-benzenemethaminium chloride (Chem. Abstracts Reg. No. 122988-32-3).

Examples of polymerizable unsaturated sulfonium salts include dialkylsulfonium salts such as [4-ethoxy-3-(ethoxycarbonyl)-2-methylene-4-oxobutyl] dimethylsulfonium bromide (Chem. Abstracts Reg. No. 63810-34-4); and vinylbenzyl dialkylsulfonium salts such as vinylbenzyl dimethyisulfonium chloride. Examples of polymerizable cyclic sulfonium salts include 1-[4-[(ethenylphenyl)methoxylphenyl]tetrahydro-2H-thiopyranium chloride (Chem. Abstracts Reg. No. 93926-67-1); and vinylbenzyl tetrahydrothiophenonium chloride, which can be prepared by the reaction of vinylbenzyl chloride with tetrahydrothiophene.

Examples of polymerizable phosphonium salts include 2-methacryloxyethyltri-$C_1$–$C_{20}$-alkyl-, aralkyl-, or arylphosphonium salts such as 2-methacryloxyethyltri-n-octadecylphosphonium halide (Chem. Abstracts Reg. No. 166740-88-1); tri-$C_1$–$C_{18}$-alkyl-, aralkyl-, or arylvinylbenzyl-phosphonium salts such as trioctyl-3-vinylbenzylphosphonium chloride, trioctyl-4-vinylbenzylphosphonium chloride (Chem. Abstracts Reg. No. 15138-12-4), tributyl-3-vinylbenzyiphosphonium chloride, tributyl-4-vinylbenzylphosphonium chloride (Chem. Abstracts Reg. No. 149186-03-8), triphenyl-3-vinylbenzylphosphonium chloride, and triphenyl-4-vinylbenzylphosphonium chloride (Chem. Abstracts Reg. No. 145425-78-1); $C_3$–$C_{18}$-alkenyltrialkyl-, aralkyl-, or aryl-phosphonium salts such as 7-octenyltriphenylphosphonium bromide (Chem. Abstracts Reg. No. 82667-45-6); and tris(hydroxymethyl)(1-hydroxy-2-propenyl)phosphonium salts (Chem. Abstracts Reg. No. 73082-48-1).

An example of a polymerizable monomer that contains both a weak acid group and a strong cationic group is N-(4-carboxy)benzyl-N,N-dimethyl-2-[(2-methyl-1-oxo-2-propenyl)oxy]ethanaminium chloride (HOOCC$_6$H$_4$CH$_2$N$^+$(CH$_3$)$_2$CH$_2$CH$_2$OOCC(CH$_3$)=CH$_2$), which can be prepared by reacting 2-(dimethylamino)ethyl acrylate with 4-(chloromethyl)benzoic acid.

It is possible to add strong cationic functionality to an already prepared polymer. For example, a polymerizable monomer having a weak acid group can be copolymerized with a vinylbenzyl halide to form a polymer having a weak acid group and a benzyl halide group. This polymer can then be post-reacted with a nucleophile such as a tertiary amine or a dialkyl sulfide, which can displace the halide group and form a benzylonium salt:

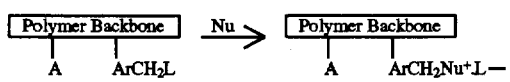

where A is a pendant weak acid group; Ar is an aromatic group, preferably a phenyl group; L is a leaving group, preferably a halide group, more preferably a chloride group; and Nu is a dialkyl sulfide such as dimethyl sulfide and diethyl sulfide; a cyclic sulfide such as tetrahydrothiophene; or a tertiary amine such as trimethyl amine, triethyl amine, tripropyl amine, tributyl amine, and triethanol amine. The leaving group, L, can be replaced with a bicarbonate counterion by any suitable method, such as those described herein.

Examples of non-interfering polymerizable monomers include acrylates such as methyl acrylate, ethyl acrylate, butyl acrylate, 2-hydroxyethyl acrylate, 2-hydroxypropyl acrylate, glycidyl acrylate, and allyl acrylate; methacrylates such as methyl methacrylate, ethyl methacrylate, butyl methacrylate, allyl methacrylate, glycidyl methacrylate, 2-hydroxyethyl methacrylate, and 2-hydroxypropyl methacrylate; alkenyl aromatic hydrocarbons such as 4-methacryloxy-2-hydroxy-benzophenone, 2-(2'-hydroxy-5-methacrylyloxyethylphenyl)-2H-benzotriazole; and C$_1$–C$_4$ alkyl- or alkenyl-substituted styrenes, preferably styrene, α-methylstyrene, vinyltoluene, and divinylbenzene. Other examples of non-interfering species include C$_3$–C$_{18}$-perfluoroalkyl methacrylates such as 2-(perfluorooctyl)ethyl methacrylate; C$_3$–C$_{18}$-perfluoroalkyl acrylates such as 2-[ethyl[(heptadecafluorooctyl)sulfonyl]amino]ethyl 2-propenoate; and C$_3$–C$_{18}$-perfluoroalkyl vinylbenzenes. (See U.S. Pat. No. 4,929,666, col. 4, lines 54–68, and col. 5, lines 1–30, incorporated herein by reference.)

The presence of UV absorbing species such as 4-methacryloxy-2-hydroxybenzophenone and 2-(2'-hydroxy-5-methacrylyloxyethylphenyl)-2H-benzotriazole into the polymer backbone can provide a protective barrier for human skin against the sun.

A composition which comprises an aqueous-based solvent and a water-compatible polymer having a bicarbonate counterion can be prepared from the polymer with the non-bicarbonate counterion. The term "aqueous-based solvent" is used herein to refer to a solvent that contains water, and optionally a water-miscible organic solvent. Examples of suitable water-miscible solvents include alcohols, preferably C$_1$–C$_4$ alcohols, more preferably ethanol and isopropanol; ethers such as tetrahydrofuran and 1,4-dioxane; glycols such as ethylene glycol and propylene glycol; C$_1$–C$_4$alkylene glycol monoalkyl or dialkyl ethers such as the monomethyl, monoethyl, monobutyl, dimethyl, diethyl, dibutyl, and ethylmethyl ethers of ethylene glycol and propylene glycol; C$_1$–C$_4$ dialkylene glycol dialkyl ethers, such as diethylene glycol dimethyl ether, diethylene glycol diethyl ether, and diethylene glycol dibutyl ether; acetone; dimethylformamide; and N-methylpyrrolidone. Carbon dioxide can also be used as a cosolvent.

The solution comprising an aqueous-based solvent and the water-compatible polymer having a bicarbonate counterion can be prepared by the steps of: 1) precipitating the polymer having a non-bicarbonate counterion by adding dilute base to a first solution comprising a first aqueous-based solvent and the polymer; 2) isolating and washing the precipitate with water; and 3) redissolving the polymer in a second aqueous-based solvent and carbon dioxide and/or carbonic acid.

This preparation replaces at least a portion of the non-bicarbonate ions with bicarbonate ions and removes at least a portion of the non-bicarbonate ions from the solution. The replacement of the non-bicarbonate ion with the bicarbonate ion is sufficient to render the polymer soluble in the second aqueous-based solvent. Preferably, not less than 20 percent, more preferably not less than 50 percent, even more preferably not less than 70 percent, and most preferably not less than 90 percent of the non-bicarbonate ions are replaced with bicarbonate ions.

The pH of the composition comprising the redissolved polymer and the second aqueous-based solvent is sufficiently low to render and keep the polymer soluble in the solvent. The pH is preferably not higher than the pK$_a$ of the weak acid group, more preferably not higher than 5, and most preferably not higher than 4. The first and second aqueous-based solvents may be the same or different.

The polymer requires a sufficient concentration of weak acid groups, anions of weak acid groups, and strong cationic groups (the sum of which is referred to hereinafter as the "total potential charge") to render the polymer soluble in the aqueous-based solvents. Preferably, the total potential charge is not less than 0.05, more preferably, not less than 0.1, and most preferably, not less than 0.5 meq of total potential charge per gram of the polymer. Preferably, the total potential charge is not more than 10, more preferably not more than 6, and most preferably not more than 3 meq of total potential charge per gram of the polymer.

Preferably, the non-interfering polymerizable monomer comprises not less than about 50 mole percent, more preferably not less than about 70 mole percent, and most preferably not less than about 90 mole percent of the total monomers used to prepare the soluble polymer.

A preferred method of preparing a stable aqueous colloidal dispersion (i.e., a latex) comprising a continuous phase and a dispersible polymer having a backbone with at least one pendant weak acid group and at least one pendant strong cationic group associated with a bicarbonate counterion comprises the steps of: 1) preparing a seed latex; 2) diluting the seed latex with water; 3) contacting the diluted solution with a radical initiator, a polymerizable ethylenically unsaturated monomer or monomers having at least one weak acid group and at least one strong cationic group associated with a non-bicarbonate counterion; 4) polymerizing the solution from step 3 under such conditions to form a latex having pendant strong cationic groups and pendant weak acid groups; and 5) exchanging the non-bicarbonate counterion with bicarbonate and removing the non-bicarbonate counterion.

The seed latex is preferably prepared by emulsion polymerization in a batch process using a cationic or non-ionic surfactant, more preferably a cationic surfactant. The seed latex acts as a locus of polymerization for subsequent monomer addition, so that the formation of new particles is minimized and greater uniformity in the distribution of particle size in the final product is achieved. Thus, the monomer or monomers used to prepare the seed latex are chosen to form particles that have an affinity for the monomers subsequently added, so that polymerization occurs preferentially in or on the seed latex particles. The extent to which the seed latex is diluted in step 2 is a function of the desired particle size and the percent solids in the final latex, and can be readily determined by one of ordinary skill in the art.

Preferably, the amount of the non-interfering polymerizable monomer used to prepare the latex generally composes up to 98 mole percent of the monomers used to prepare the polymer. Preferably, the non-interfering polymerizable monomer comprises not less than about 50 mole percent, more preferably not less than about 75 mole percent, and most preferably not less than about 90 mole percent of the total monomers used to prepare the latex. The total potential charge of the latex is preferably not more than 3, more preferably not more than 2, and most preferably not more than 1 meq/g of polymer. The total potential charge of the latex is preferably not less than 0.05, more preferably not less than 0.1, and most preferably not less than 0.2 meq/g of polymer.

The non-bicarbonate ion can be exchanged with a bicarbonate ion in step 5, preferably by first saturating under pressure an aqueous-based solution or dispersion of the polymer with carbon dioxide, either as dry ice or as a dispersion with an ng the $CO_2$-saturated polymer dispersion with an ion exchange resin that contains bicarbonate functionality such as DOWEX™ Monosphere 550A anion exchange resin (a trademark of The Dow Chemical Company) in the bicarbonate form. The pH of the composition comprising the stable aqueous dispersion of the polymer is sufficiently low to render the polymer stable in the continuous phase, preferably lower than the $pK_a$ of the weak acid group, more preferably not greater than 5, and most preferably not greater than 4.

It is also possible to prepare a stable aqueous dispersion from a preformed polymer having at least one pendant weak acid group and at least one pendant strong cationic group associated with a non-bicarbonate counterion. The preformed polymer can be dissolved in a suitable solvent, then dispersed in water by any suitable method. The solvent can then be removed and the solids content adjusted to form a so-called artificial latex. This non-bicarbonate counterion can then be exchanged with a bicarbonate counterion.

When a composition containing an aqueous-based solvent and the dissolved polymer is applied to a substrate, the weak acid becomes deprotonated upon evolution of carbon dioxide. The now deprotonated acid is available to form an ion pair with a strong cation of the same or different polymer backbone, thereby producing a material that is incompatible with the aqueous-based solvent. Inasmuch as the anion is the conjugate base of a weak acid, a weak acid such as an aqueous solution of vinegar or citric acid is sufficient to break up ionic pairing, thereby allowing for the easy removal of the coating from the substrate.

The water-incompatible coating can be subsequently heated or irradiated with UV light to form a permanent coating, that is, a coating that is resistant to removal by aqueous-based acids or bases, provided the polymer contains crosslinkable groups such as benzylonium groups, glycidyl groups, or allylic groups. A coating that contains these UV-crosslinkable groups is particularly useful as a photoresist for printed circuit boards.

It is further possible to form a permanent coating by post-reacting crosslinking functionality onto the polymer backbone, as illustrated.

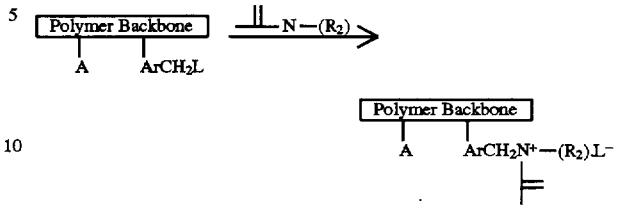

For example, vinylbenzyl chloride can be copolymerized with acrylic acid to form a polymer containing acid and benzyl chloride functionality. The polymer can then be post-reacted with an ethylenically unsaturated tertiary amine such as dimethylaminoethylmethacrylate to form a compatible, crosslinkable quaternary ammonium chloride, which can then be exchanged with bicarbonate. This solvent-compatible, crosslinkable polymer can then be applied to a surface to subsequently form a coating and crosslinked by any suitable method such as radical initiated polymerization.

In another preferred aspect of the present invention, a permanent coating can also be prepared from a latex. Application of the latex to a substrate causes loss of $CO_2$ and a dry-to-the-touch film. The dry latex-based film is resistant to acidic or basic water-based solvents.

The compositions of the present invention may also contain dyes, fillers, pigments, anti-bacterial agents, fungicides, anti-oxidants, perfumes, and the like. These compositions are useful as floor coatings; wood primers; skin care products including moisture barriers, sunscreens, and cosmetics; fingernail polishes; photoresists for printed circuit boards; paints, particularly latex spray paints; automotive and aircraft coatings; liquid- and gas-permeable membranes; coatings for fabrics; and hair care products.

The following examples are for illustrative purposes only and are not intended to limit the scope of this invention. All percentages are based on weight unless otherwise indicated.

EXAMPLE 1

Preparation of a Removable Coating from a Dissolved Polymer

Four liquid streams are added simultaneously and continuously to a nitrogen-purged reaction vessel maintained at 60° C. and containing water (30 g) and 2-propanol (30 g). The liquids are added over five hours. The liquid streams are identified as follows:

| Stream | Component | Amount |
| --- | --- | --- |
| 1 | methyl methacrylate | 78.1 g (0.78 mole) |
|   | acrylic acid | 7.95 g (0.11 mole) |
| 2 | water | 75 g |
|   | M-quat[a] | 30.9 g[a] (0.11 mole) |
| 3 | 2-propanol | 75 g |
|   | 2,2'-azobis(2,4-dimethylpentane nitrile)[b] | 1.00 g |
| 4 | water | 45 g |
|   | 2-propanol | 45 g |

[a]2-(methacryloxyloxy)ethyl] trimethylammonium chloride obtained as a 74 percent aqueous solution from Bimax Inc., 717 Chesapeake Ave., Baltimore, MD 21225
[b]obtained from E. I. Du Pont de Nemours and Co.

After the addition is complete, the reaction solution temperature is maintained at 60° C. for an additional 2 hours.

The solution is then cooled, whereupon a portion of the solution (29.3 g) is added with stirring to a sodium carbonate solution (275 mL, 0.2M). After stirring for 10 hours, the product, which is a stringy gel, is isolated by filtration, followed by immersion in water (500 mL) for 1 hour. Filtration and immersion are repeated four times before the isolated gel is dried under vacuum to yield 11.7 g of solid polymer.

A solution containing 5 percent of the dried polymer, 5 percent of N-methyl pyrrolidone, 45 percent 2-propanol, and 45 percent water is prepared. Dry ice is added to facilitate dissolution of the polymer. A portion of the formulation is applied to a painted metal surface, then drawn along the surface with a KIMWIPES™ EXL tissue (a trademark of Kimberly Clark Corporation, Roswell, Ga. 30076-2199) to produce a thin coating. After 1 minute, the resulting clear coating is dry to the touch and resistant to running water. After 4 hours the hard coating could not be removed by rubbing 30 times with a cotton swab wetted with either water or isopropanol. The coating is removed with a solution of 0.1N citric acid dissolved in a 1:1 mixture of water and isopropanol.

EXAMPLE 2

Preparation of a Composition for Mammalian Skin Applications

The liquid streams are identified as follows:

| Stream | Component | Amount |
|---|---|---|
| 1 | methyl methacrylate | 32.2 g (0.32 mole) |
| | acrylic acid | 5.0 g (0.07 mole) |
| | 2-hydroxyethylmethacrylate | 48.4 g (0.37 mol) |
| | M-quat | 14.4 g (0.05 mole) |
| 2 | sodium formaldehyde sulfoxylate | 0.15 g[c] |
| 3 | t-butylhydroperoxide | 0.29 g[d] |

[c]added as a solution in 24 g of water
[d]70 percent active, added as a solution in 24 g water To a flask containing water (420 mL) and isopropanol (100 g) is added with stirring 9-mL shots of Stream 1, 2-mL shots of Stream 2, and 2-mL shots of Stream 3. The shots are added at 5-minute intervals until additions are complete. The reaction mixture is stirred at 50° C. for three hours, whereupon the polymer is cooled down. An excess of dry ice and DOWEX™ Monosphere 550A anion exchange resin in the bicarbonate form is added to the solution with stirring for 5 minutes. The resin is then filtered off and the filtrate is collected and evaluated as a moisture barrier in the following manner.

A portion of the filtrate is applied to the skin of a 3 to 4-week-old hairless mouse. The mouse is maintained on a diet deficient in essential fatty acids, which causes high rates of water loss from the skin and severe scaling of the top layer of the skin. Daily topical applications of the formulation over a 5-day period results in reductions in trans-epidermal water loss (TEWL, as measured by a Servomed Evaporimeter) from 18 g/m$^2$/hr to 10 to 12 g/m$_2$/hr. A smoothing of the skin (that is, a reduction of scaling) is also observed.

EXAMPLE 3

Preparation of a Coating from a Latex

A latex is prepared using a 2-step process. First, a cationic surfactant stabilized polystyrene seed latex is prepared using a batch process. Second, a portion of the seed latex is used in a continuous addition process to prepare a film-forming latex containing a carboxylic acid and a quaternary ammonium functional monomer.

A cationic polystyrene seed latex is prepared using octadecyltrimethylammonium chloride quaternary surfactant (20 g per 100 g of the styrene monomer). A hydrogen peroxide/iron oxidation-reduction pair is used to initiate the styrene polymerization. The polymerization is carried out for 2 hours at 70° C. under a nitrogen atmosphere. The resulting seed latex is 36.4 weight percent solids and its mean volume particle size (determined by hydrodynamic chromatography) is 343 Å.

Water (452 g) and a portion of the seed latex (8.8 g) are mixed together and transferred to a flask. The mixture is stirred at 60° C. under a nitrogen purge for 30 minutes, whereupon the following liquid streams are continuously added over 4 hours:

| Stream | Component | Amount |
|---|---|---|
| 1 | methyl methacrylate | 124 g (1.24 mole) |
| | butyl acrylate | 176 g (1.38 mole) |
| | methacrylic acid | 5.3 g (0.06 mol) |
| 2 | water | 16 g |
| | M-quat | 17.3 g[a] (0.06 mole) |
| 3 | water | 16 g |
| | t-butylhydroperoxide | 1.82 g |
| 4 | water | 16 g |
| | sodium formaldehyde sulfoxylate | 0.96 g |

After the addition is complete, the mixture is stirred for an additional 1 hour, then allowed to cool. The resulting dispersion is milky white. Hydrodynamic chromatography shows a mean volume particle size of 1785 Å. The following ion exchange process is used to convert the cationic latex. DOWEX™ Monosphere 550A anion exchange resin in the bicarbonate form, (10 mL) is added to a first vessel. The first vessel is flushed with 3 volumes of $CO_2$ gas then pressurized to 30 psig with $CO_2$ gas. A portion of the prepared latex is placed in a second vessel, which is flushed twice with $CO_2$ gas, then pressurized to 30 psig with $CO_2$ gas. The second vessel is placed in an ice water bath and shaken intermittently for 10 minutes to maximize $CO_2$ absorption into the latex. The contents of the second vessel are transferred to the first vessel under a positive pressure of $CO_2$ gas. The latex remains in contact with the anion exchange resin under a positive pressure of $CO_2$ gas until ready for use.

A film of the latex is cast onto a glass plate using a 10-mil draw down cup under ambient conditions (22.4° C., 65% relative humidity). In less than one minute of air exposure, a film formed that was dry to the touch.

EXAMPLE 4

A polymer gel is prepared, precipitated, and washed (but not dried) as described in Example 1. The isolated gel (28.6 g, 9.30 weight percent solids), the monomethyl ether of propylene glycol (3.2 g), propylene glycol (0.80 g), and 2-propanol (0.70 g) are all loaded into a pressure vessel. The vessel is pressurized under $CO_2$ to 40 lb/in$^2$ and shaken for one hour, to dissolve the gel. A coating is prepared by first allowing a portion of the solution to escape through a valve onto a painted substrate, followed by drawing down a film with a KIMWIPES™ EXL tissue. After 1 minute, the film is dry to the touch, and after 10 minutes, the coating cannot be removed by 20 wipings with a water-wet cotton swab. The coating is removed with a solution of 0.1N citric acid dissolved in a 1:1 mixture of water and isopropanol.

What is claimed is:

1. A composition comprising an aqueous-based solvent and a polymer having a backbone with at least one pendant weak acid group and at least one pendant strong cationic group associated with a bicarbonate counterion, wherein the strong cationic group is formed from the polymerization of a trialkylammoniumalkyl acrylate, a trialkylammoniumalkyl methacrylate, a trialkylammoniumalkyl acrylamide, a 2-methacryloxyethyl-tri-$C_1$-$C_{20}$-alkyl- phosphonium salt, a $C_3$-$C_{18}$-alkenyltrialkyl-phosphonium salt, or a polymerizable monomer that contains both strong cationic groups and weak anionic groups.

2. The composition of claim 1 wherein the polymer backbone further contains units formed from the polymerization of a non-interfering polymerizable monomer selected from the group consisting of methyl acrylate, ethyl acrylate, butyl acrylate, 2-hydroxyethyl acrylate, 2-hydroxypropyl acrylate, allyl acrylate, glycidyl acrylate, methyl methacrylate, ethyl methylacrylate, butyl methacrylate, allyl methacrylate, glycidyl methacrylate, 2-hydroxyethyl methacrylate, 2-hydroxypropyl methacrylate, a $C_3$-$C_{18}$-perfluoroalkyl methacrylate, a $C_3$-$C_{18}$-perfluoroalkyl acrylate, a $C_3$-$C_{18}$-perfluoroalkyl vinylbenzene, styrene, α-methylstyrene, or vinyltoluene, or a mixture thereof.

3. The composition of claim 1 wherein the polymer backbone further contains units formed from the polymerization of a non-interfering polymerizable monomer selected from the group consisting of methyl methacrylate, butyl acrylate, 2-hydroxyethyl methacrylate, 4-methacryloxy-2-hydroxy-benzophenone, 2-(2'-hydroxy-5-methacrylyloxyethylphenyl)-2H-benzotriazole, or a mixture thereof.

4. The composition of claim 2 wherein the pendant weak acid group is formed from the polymerization of a monomer selected from the group consisting of acrylic acid, methacrylic acid, itaconic acid, β-carboxyethyl acrylate, vinylbenzoic acid, vinylchlorophenol, vinylbromophenol, vinylthiophenol, and 2-propenoic acid: 2-methyl-, (hydroxyphosphinyl) methyl ester.

5. The composition of claim 4 wherein the pendant strong cationic group is formed from the polymerization of 2-trimethylammonium chloride, and the non-interfering polymerizable monomer is selected from the group consisting of 2-hydroxyethyl methacrylate, methyl methacrylate, and butyl methacrylate.

6. A method of preparing a composition comprising an aqueous-based solvent and a water-compatible polymer that is soluble in the aqueous-based solvent, the polymer having a backbone with at least one pendant weak acid group and at least one pendant strong cationic group associated with a bicarbonate counterion, the method which comprises the steps of:

a) preparing a solution comprising a first aqueous-based solvent and a polymer having a backbone that contains at least one pendant weak acid group and at least one pendant strong cationic group associated with a non-bicarbonate counterion;

b) adding sufficient base to the solution to precipitate at least a portion of the polymer;

c) washing the precipitate with water; and d) contacting the precipitate with a second aqueous-based solvent and a sufficient amount of carbon dioxide or carbonic acid to render the precipitate soluble in the second aqueous-based solvent.

7. The method of claim 6 wherein the polymer backbone further includes units formed from the polymerization of a non-interfering polymerizable monomer selected from the group consisting of methyl acrylate, ethyl acrylate, butyl acrylate, 2-hydroxyethyl acrylate, 2-hydroxypropyl acrylate, allyl acrylate, glycidyl acrylate, methyl methacrylate, ethyl methylacrylate, butyl methacrylate, allyl methacrylate, glycidyl methacrylate, 2-hydroxyethyl methacrylate, 2-hydroxypropyl methacrylate, a $C_3$-$C_{18}$-perfluoroalkyl methacrylate, a $C_3$-$C_{18}$-perfluoroalkyl acrylate, a $C_3$-$C_{18}$-perfluoroalkyl vinylbenzene, styrene, α-methylstyrene, and vinyltoluene.

8. The method of claim 6 wherein the pendant weak acid group is formed from the polymerization of a monomer selected from the group consisting of acrylic acid, methacrylic acid, itaconic acid, β-carboxyethyl acrylate, a vinylbenzoic acid, a vinylchlorophenol, a vinylbromophenol, a vinylthiophenol, or 2-propenoic acid: 2-methyl-, (hydroxyphosphinyl)methyl ester.

9. The method of claim 7 wherein the non-interfering polymerizable monomer is selected from the group consisting of methyl methacrylate, butyl acrylate, 2-hydroxyethyl methacrylate, 4-methacryloxy-2-hydroxy-benzophenone, and 2-(2'-hydroxy-5-methacrylyloxyethylphenyl)-2H-benzotriazole.

10. The method of claim 9 wherein the pendant strong cationic group associated with a non-bicarbonate counterion is 2-trimethylammonium chloride, and the pendant weak acid group is formed from the polymerization of acrylic acid or methacrylic acid.

11. A composition comprising a stable aqueous dispersion of a polymer having a backbone containing pendant weak acid groups, and pendant strong cationic groups associated with bicarbonate counterions wherein the composition has a pH of not greater than 5.

12. The composition of claim 11 which is prepared by the steps of:

a) continuously adding to a mixture of water and a cationic surfactant stabilized polystyrene seed latex a polymerizable monomer containing a weak acid group, a polymerizable monomer containing a strong cationic group associated with a non-bicarbonate counterion, and a non-interfering polymerizable monomer;

b) polymerizing the polymerizable monomers under such conditions to form a stable aqueous dispersion having pendant strong cationic groups associated with non-bicarbonate counterions, pendant weak acid groups, and pendant non-interfering groups; and c) saturating the dispersion with $CO_2$ under pressure, then contacting the $CO_2$-saturated dispersion with an ion exchange resin that contains bicarbonate functionality, thereby exchanging the non-bicarbonate counterion with bicarbonate.

13. The composition of claim 12 wherein the non-interfering polymerizable monomer is selected from the group consisting of methyl acrylate, ethyl acrylate, butyl acrylate, 2-hydroxyethyl acrylate, 2-hydroxypropyl acrylate, allyl acrylate, glycidyl acrylate, methyl methacrylate, ethyl methylacrylate, butyl methacrylate, allyl methacrylate, glycidyl methacrylate, 2-hydroxyethyl methacrylate, 2-hydroxypropyl methacrylate, a $C_3$-$C_{18}$-perfluoroalkyl methacrylate, a $C_3$-$C_{18}$-perfluoroalkyl acrylate, a $C_3$-$C_{18}$-perfluoroalkyl vinylbenzene, styrene, α-methylstyrene, and vinyltoluene.

14. The composition of claim 12 wherein the non-interfering polymerizable monomer is selected from the group consisting of methyl methacrylate, butyl acrylate, 2-hydroxyethyl methacrylate, 4-methacryloxy-2-hydroxybenzophenone, and 2-(2'-hydroxy-5-methacrylyloxyethylphenyl)-2H-benzotriazole.

15. The composition of claim 13 wherein the amount of the non-interfering polymerizable monomer used to prepare the stable aqueous dispersion represents from about 90 to 98 weight percent of the monomers used to prepare the polymer.

16. The composition of claim 12 which is prepared from a preformed polymer.

* * * * *

UNITED STATES PATENT AND TRADEMARK OFFICE
CERTIFICATE OF CORRECTION

PATENT NO. : 5,674,934
DATED : October 7, 1997
INVENTOR(S) : Donald L. Schmidt, Gene D. Rose It is certified that error appears in the above-indentified patent and that said Letters Patent is hereby corrected as shown below:

Title page, under Inventors, please delete "Barbara A. Miller,".

Title page, under Inventors, "all" should read --both--.

Col. 11, line 34, "2-trimethylammonium chloride" should read --2-[(methacryloyloxy)ethyl] trimethylammonium chloride--.

Col. 12, line 16, "2-trimethylammonium chloride" should read --2-[(methacryloyloxy)ethyl] trimethylammonium chloride--.

Signed and Sealed this

Seventeenth Day of February, 1998

Attest:

BRUCE LEHMAN

*Attesting Officer*          *Commissioner of Patents and Trademarks*